United States Patent
Yoo et al.

(10) Patent No.: US 9,263,098 B2
(45) Date of Patent: Feb. 16, 2016

(54) VOLTAGE REGULATOR, MEMORY CONTROLLER AND VOLTAGE SUPPLYING METHOD THEREOF

(71) Applicants: Sungmin Yoo, Seoul (KR); Dae-Yong Kim, Seoul (KR); JuHwa Kim, Hwaseong-si (KR)

(72) Inventors: Sungmin Yoo, Seoul (KR); Dae-Yong Kim, Seoul (KR); JuHwa Kim, Hwaseong-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 0 days.

(21) Appl. No.: 14/504,911

(22) Filed: Oct. 2, 2014

(65) Prior Publication Data

US 2015/0162055 A1    Jun. 11, 2015

(30) Foreign Application Priority Data

Dec. 11, 2013    (KR) .................. 10-2013-0153985

(51) Int. Cl.
*G11C 5/14* (2006.01)
*H02M 3/158* (2006.01)

(52) U.S. Cl.
CPC ............... *G11C 5/147* (2013.01); *H02M 3/158* (2013.01)

(58) Field of Classification Search
CPC ........ G11C 5/144; G11C 5/148; G11C 29/00; G11C 2207/2227
USPC .................... 365/226, 227, 189.09
See application file for complete search history.

(56) References Cited

U.S. PATENT DOCUMENTS

| | | | |
|---|---|---|---|
| 6,429,725 B1 * | 8/2002 | Tanzawa | H02M 3/073 327/536 |
| 7,233,134 B2 | 6/2007 | Huang et al. | |
| 7,436,162 B2 | 10/2008 | Walters | |
| 7,508,179 B2 | 3/2009 | Cowell et al. | |
| 7,626,368 B2 | 12/2009 | Novak | |
| 7,683,592 B2 | 3/2010 | Soude et al. | |
| 7,863,875 B1 | 1/2011 | Guo et al. | |
| 8,080,982 B2 | 12/2011 | Lin et al. | |
| 8,080,983 B2 | 12/2011 | Lourens et al. | |
| 8,089,822 B1 | 1/2012 | Chankya et al. | |
| 8,344,713 B2 | 1/2013 | Shrivas et al. | |
| 2002/0060943 A1 * | 5/2002 | Jo | G11C 8/08 365/226 |
| 2002/0153941 A1 * | 10/2002 | Tanzawa | G11C 5/145 327/536 |
| 2004/0232900 A1 | 11/2004 | Huang et al. | |
| 2004/0257056 A1 | 12/2004 | Huang et al. | |
| 2005/0088856 A1 | 4/2005 | Yamamoto et al. | |
| 2006/0232252 A1 | 10/2006 | Walters | |

(Continued)

FOREIGN PATENT DOCUMENTS

KR    1020050039577 A    4/2005

OTHER PUBLICATIONS

Linear Technology, "5-Bit Programmable Synchronous Switching Regulator Controller for Pentium ® II Processor", pp. 1-24.

*Primary Examiner* — Han Yang
(74) *Attorney, Agent, or Firm* — Harness, Dickey & Pierce, P.L.C.

(57) ABSTRACT

A memory controller of inventive concepts may include an active regulator configured to operate in an active mode and be inactive in a sleep mode, an active logic configured to receive a drive voltage, a power gating switch configured to connect the active regulator to the active logic after a transient state of the active mode, the transient state being an initial time period of the active mode, and a charging circuit configured to charge the active logic during the transient state.

20 Claims, 14 Drawing Sheets

(56) References Cited

U.S. PATENT DOCUMENTS

| | | |
|---|---|---|
| 2007/0236279 A1 | 10/2007 | Novak |
| 2008/0054867 A1 | 3/2008 | Soude et al. |
| 2008/0122416 A1 | 5/2008 | Cowell et al. |
| 2010/0026252 A1 | 2/2010 | Lin et al. |
| 2010/0109624 A1 | 5/2010 | Lourens et al. |
| 2012/0176107 A1 | 7/2012 | Shrivas et al. |

* cited by examiner

VOLTAGE REGULATOR, MEMORY CONTROLLER AND VOLTAGE SUPPLYING METHOD THEREOF

CROSS-REFERENCE TO RELATED APPLICATIONS

This U.S. non-provisional patent application claims priority under 35 U.S.C. §119 of Korean Patent Application No. 10-2013-0153985, filed on Dec. 11, 2013, the entire contents of which are hereby incorporated by reference.

BACKGROUND

Inventive concepts relate to semiconductor devices such as a voltage regulator, a memory controller and a voltage supplying method thereof.

The use of a mobile device such as a smart phone, a tablet PC, a digital camera, a MP3 player, an e-book, etc. is increasing. As the amount of data being processed by a mobile device increases, a higher processing speeds are being adopted in the mobile device. In addition, a high performance and high capacity nonvolatile storage medium is used in the mobile device. For example, a built-in memory such as an embedded multimedia card (eMMC) is being used as a storage medium of a mobile device.

An embedded multimedia card (eMMC) is a multi-chip package (MCP) in which a memory controller and a plurality of memory chips are embedded. Capacitors for power supply that are mounted in an embedded multimedia card (eMMC) are being gradually removed to improve yield and realize a lighter weighter and smaller size. A multi-layer ceramic capacitor (MLCC) is mainly used as a capacitor for a power supply. A capacitor for a power supply may be mounted on the outside of an embedded multimedia card (eMMC).

Stable power supply improves operation reliability of a semiconductor device, including a mobile device.

SUMMARY

Inventive concepts provide a voltage regulator, a memory controller and a memory system that provide a stable power supply that does not depend on a capacitor for power supply.

At least some example embodiments of inventive concepts provide a memory controller. The memory controller may include an active regulator configured to operate in an active mode and be inactive in a sleep mode, an active logic configured to receive a drive voltage, a power gating switch configured to connect the active regulator to the active logic after a transient state of the active mode, the transient state being an initial time period of the active mode, and a charging circuit configured to charge the active logic during the transient state.

An example embodiment of inventive concepts provides a voltage regulator of a semiconductor device. The voltage regulator may include a first regulator configured to operate in an active mode and be inactive in a sleep mode; a second regulator configured to operate in the sleep mode and the active mode, the second regulator configured to generate a sleep voltage, the second regulator and the first regulator having a common output terminal, an active logic configured to receive a drive voltage, a sleep logic configured to operate based on the sleep voltage, the sleep voltage and the drive voltage having a same voltage level, a power gating switch configured to connect the common output terminal to a power input terminal of the active logic based on a state of the active mode, and a charging circuit configured to charge the power input terminal to a reference voltage level during a transient state of the active mode.

An example embodiment of inventive concepts provides a method of supplying voltage in a mobile memory card including an active regulator configured to operate in an active mode and be inactive in a sleep mode, an active logic configured to operate in the active mode and a power gating switch located between an output terminal of the active regulator and a power input terminal of the active logic. The voltage supply method may include detecting an operation mode change from the sleep mode to the active mode, activating the active regulator based on the detecting charging the power input terminal of the active logic through a charging circuit, deactivating the charging circuit if a voltage of the power input terminal reaches a reference voltage, and activating the power gating switch if the voltage of the power input terminal reaches the reference voltage.

At least one example embodiment discloses a memory controller including an active logic configured to operate based on a drive voltage, the active logic configured to control an external memory device, a sleep logic configured to operate based on a sleep voltage, the sleep logic configured to detect a change of an operation mode of the memory controller, and a voltage regulator including a charging circuit configured to supply the drive voltage to the active logic based on the detected change, and an active regulator configured to supply the drive voltage to the active logic if the drive voltage is greater than a reference voltage.

BRIEF DESCRIPTION OF THE FIGURES

Example embodiments of inventive concepts will be described below in more detail with reference to the accompanying drawings. Example embodiments of inventive concepts may, however, be embodied in different forms and should not be constructed as limited to the embodiments set forth herein. Rather, example embodiments are provided so that this disclosure will be thorough and complete, and will fully convey the scope of the inventive concept to those skilled in the art. Like numbers refer to like elements throughout.

DETAILED DESCRIPTION OF EXAMPLE EMBODIMENTS

Figure 1:
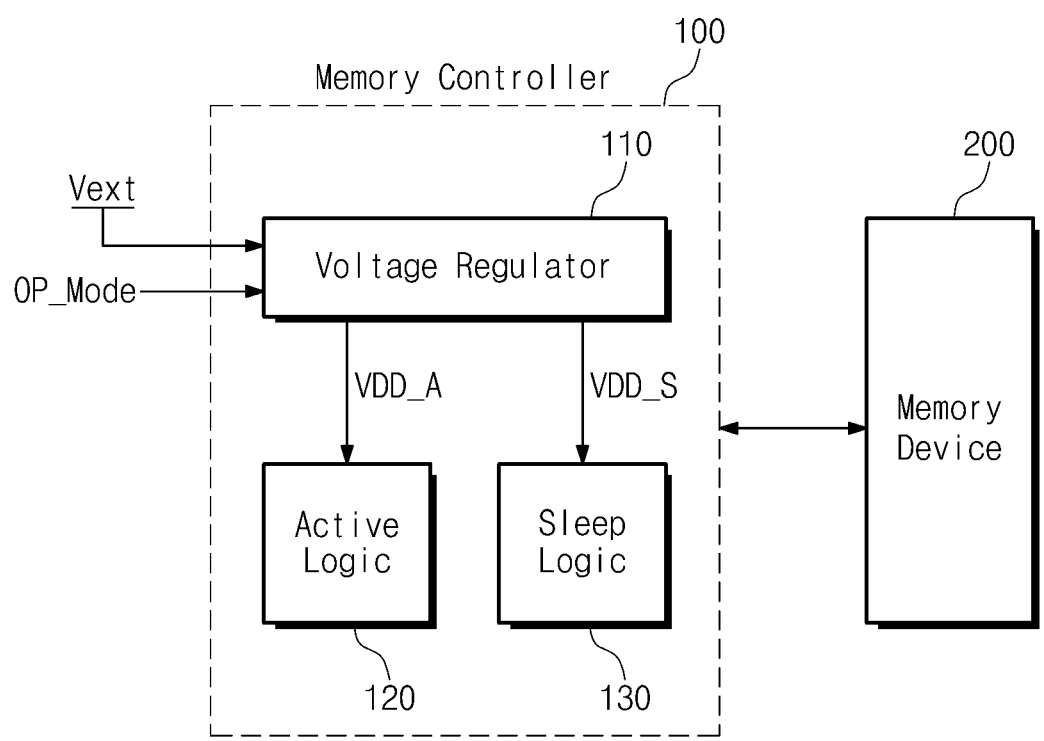
FIG. 1 is a block diagram illustrating a memory system in accordance with an example embodiment of inventive concepts.

Example embodiments of inventive concepts will be described more fully hereinafter with reference to the accompanying drawings, in which example embodiments of the are shown. Inventive concepts may, however, be embodied in many different forms and should not be construed as limited to example embodiments set forth herein. Rather, example embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

FIG. 1 is a block diagram illustrating a memory system in accordance with an example embodiment of inventive concepts. Referring to FIG. 1, a memory system includes a memory controller 100 and a memory device 200. The memory controller 100 includes a voltage regulator 110, active logic 120 and sleep logic 130.

The voltage regulator 110 is provided with an external voltage Vext and an operation mode OP_Mode signal from the outside. The voltage regulator 110 converts a level of the external voltage Vext to provide the converted voltage as drive voltages VDD_A and VDD_S for the active logic 120 and the sleep logic 130. The voltage regulator 110 may be used in a mobile memory and can separately include a regulator for a sleep mode and a regulator for an active mode. The memory system waiting in the sleep mode changes its operation mode to the active mode in a situation like a wake-up. In a wake-up, it takes a certain period of time for a dedicated active mode regulator consuming relatively a high current to output a desired drive voltage and current. Thus, when the operation mode is changed from the sleep mode to the active mode, unstability of a drive voltage due to a load increase should be removed. In addition, the voltage regulator 110 generates a drive voltage VDD_A before an active load start time of the active logic 120. The voltage regulator 110 can remove unstability of a drive voltage that occurs when an operation mode is changed without depending on a backup power capacitor.

The active logic 120 is provided with a drive voltage VDD_A from the voltage regulator 110. The active logic 120 can perform various operations for controlling the memory device 200. The active logic 120 may include, for example, a processing unit controlling the memory controller 110, a buffer memory and an error correction code ECC engine. That is, the active logic 120 may include all the circuits and devices for accessing and controlling the memory device 200. If the active logic 120 is activated, data transfer and interfacing operations for performing the data transfer occur. If the active logic 120 is activated, a relatively heavy load occurs. Thus, in the sleep mode in which the active logic 120 is substantially not used, a power management is performed by cutting off the drive voltage VDD_A to the active logic 120.

The sleep logic 130 includes circuits and devices for minimum input/output and control in the memory controller 100. That is, in the sleep mode in which the active logic 120 is turned off, only the sleep logic 130 is activated to prepare for a wake-up or memory access request from the outside. If a wake-up request from the outside is received, the request is sensed by the sleep logic 130 and a preparing operation for activating the active logic 120 begins. The sleep logic 130 may include minimum circuit and device for a standby operation.

The memory device 200 stores data and provides stored data to the memory controller 100 under the control of the memory controller 100. The memory device 200 may be a nonvolatile memory device that retains its stored data even when its power supply is interrupted. The memory device 200 may include, for example, EEPROM, FRAM, PRAM, MRAM, RRAM, NAND Flesh Memory, etc. The memory device 200 is not limited to the nonvolatile memory device described above and may be a volatile memory device.

The memory system includes the voltage regulator 110 that can supply a stable voltage when an operation mode is changed without depending on a backup power capacitor for power stability. The voltage regulator 110, when an operation mode is changed to the active mode, can set up the drive voltage VDD_A before a load start time of the active logic 120 and provide the drive voltage VDD_A.

Figure 2:
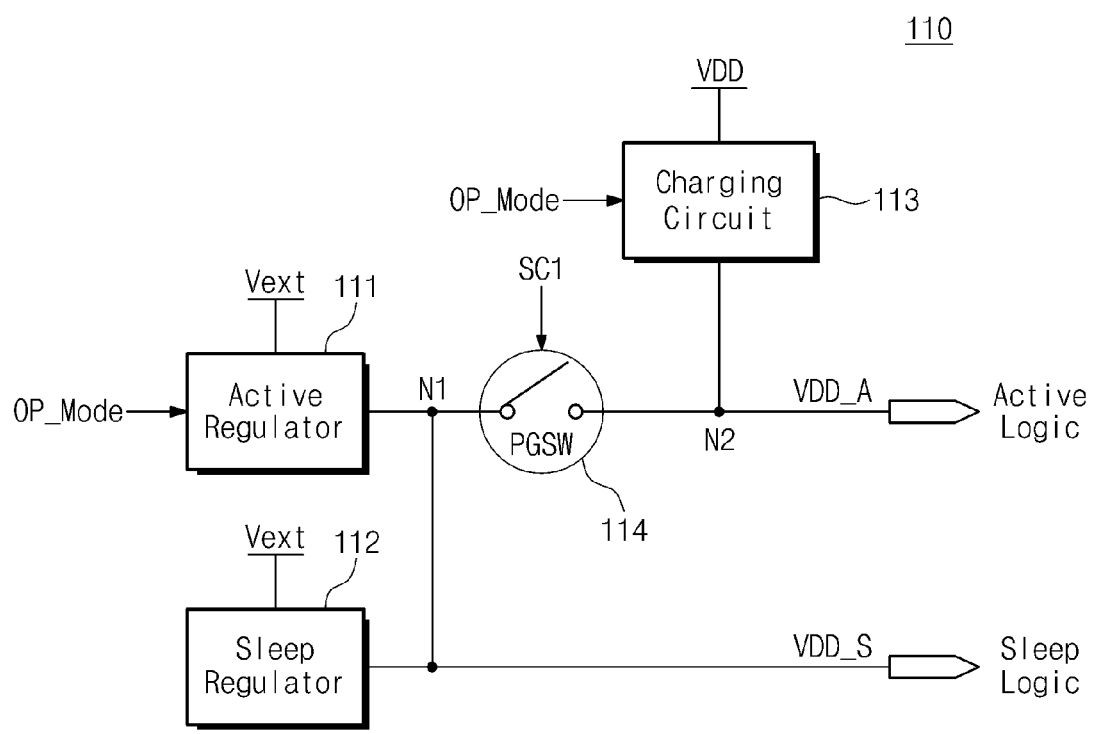
FIG. 2 is a block diagram illustrating a voltage regulator of FIG. 1.

FIG. 2 is a block diagram illustrating a voltage regulator 110 of FIG. 1. Referring to FIG. 2, the voltage regulator 110 may include an active regulator 111, a sleep regulator 112, a charging circuit 113 and a power gating switch (PGSW) 114.

The active regulator 111 may be activated or inactive in response to an operation mode OP_Mode. In the case that an operation mode OP_Mode is an active mode, the active regulator 111 generates the drive voltage VDD_A for driving the active logic 120. While, the active regulator 111 is inactivate in the sleep mode. That is, the active regulator 111 may be turned off in the sleep mode. If the operation mode OP_Mode is changed from the sleep mode to the active mode, the active regulator 111 generates the drive voltage VDD_A.

The active regulator 111 may be a low dropout (LDO) regulator. A voltage regulator may be divided into a linear regulator and a switching regulator. A DC-DC converter is a kind of switching regulator. The DC-DC converter has a high conversion efficiency. However, a noise characteristic of the linear regulator is higher than a noise characteristic of the switching regulator. The LDO regulator is a kind of linear regulator. The LDO regulator has a low conversion efficiency but has a high response speed. An output voltage of the LDO regulator includes a small amount of noises compared with an output voltage of the DC-DC converter. Thus, the LDO regulator may be used to make up for shortcomings of the DC-DC converter. In particular, the LDO regulator may be used to supply power to a noise-sensitive device and a device that has to be driven by high performance.

The sleep regulator 112 is activated in the active mode and the sleep mode. The sleep regulator 112 maintains a turn-on state in the sleep mode and continuously supplies a DC voltage in the active mode. A current supply ability of the sleep regulator 112 is relatively low compared with the active regulator 111. This is because a minimum load current for standby operation only has to be supplied in the sleep mode of the memory controller 100. The sleep regulator 112 may be an LDO regulator which is the same voltage conversion method as the active regulator 111.

The charging circuit 113 can charge a power terminal of the active logic 120 according to the operation mode. The charging circuit 113 can charge the power terminal of the active logic 120 when an operation mode is changed. The charging circuit 113 can charge the power input terminal N2 of the active logic 120 when an operation mode is changed from the sleep mode to the active mode, that is, before the power gating switch 114 is turned on. Before an output of the active regulator 111 reaches a sufficient level, a level of the active voltage VDD_A being set up in the power input terminal N2 of the active logic 120 can be boosted to a certain level.

If a level of the active voltage VDD_A reaches a desired level by the charging circuit 113, the charging circuit 113 is deactivated and the power gating switch 114 is turned on. That is, the charging circuit 113 can charge the power input terminal N2 of the active logic 120 in a transient state section in which the operation mode is changed from the sleep mode to the active mode.

The power gating switch 114 connects a common output terminal N1 of the active and sleep regulators 111 and 112 to the power input terminal N2 of the active logic 120 according to an operation mode OP_Mode. The power gating switch 114 is turned off in the sleep mode. The power gating switch 114 is also turned off in the transient state section in which a mode change occurs in the active mode. After the power input terminal N2 of the active logic 120 is charged to a desired level by the charging circuit 113 in the transient state section, the power gating switch 114 is turned on. That is, the power gating switch 114 is turned on only after an operation mode is changed from the sleep mode to the active mode and the transient state section is finished.

The power gating switch 114 is provided with a first switch control signal SC1 to perform the switching control. Based on the switch control signal SC1, the power gating switch 114 maintains a turn-off state in the transient terminal section in which the operation mode is changed from the sleep mode to the active mode. After the transient state section is finished, the power gating switch 114 may be turned on. The first switch control signal SC1 can be generated through control logic inside the memory controller 100 or a control circuit inside the voltage regulator 110.

The voltage regulator 110 turns off the power gating switch 114 and charges the power input terminal N2 of the active logic 120 in the transient terminal section in which the operation mode is changed from the sleep mode to the active mode. After the power input terminal N2 of the active logic 120 is charged to the desired level, the common output terminal N1 of the active and sleep regulators 111 and 112 is electrically connected to the power input terminal N2 of the active logic 120. Through control of the transient state section, instability of the drive voltage VDD_A provided to the active logic 120 can be solved and the active logic 120 can be activated.

Figure 3:
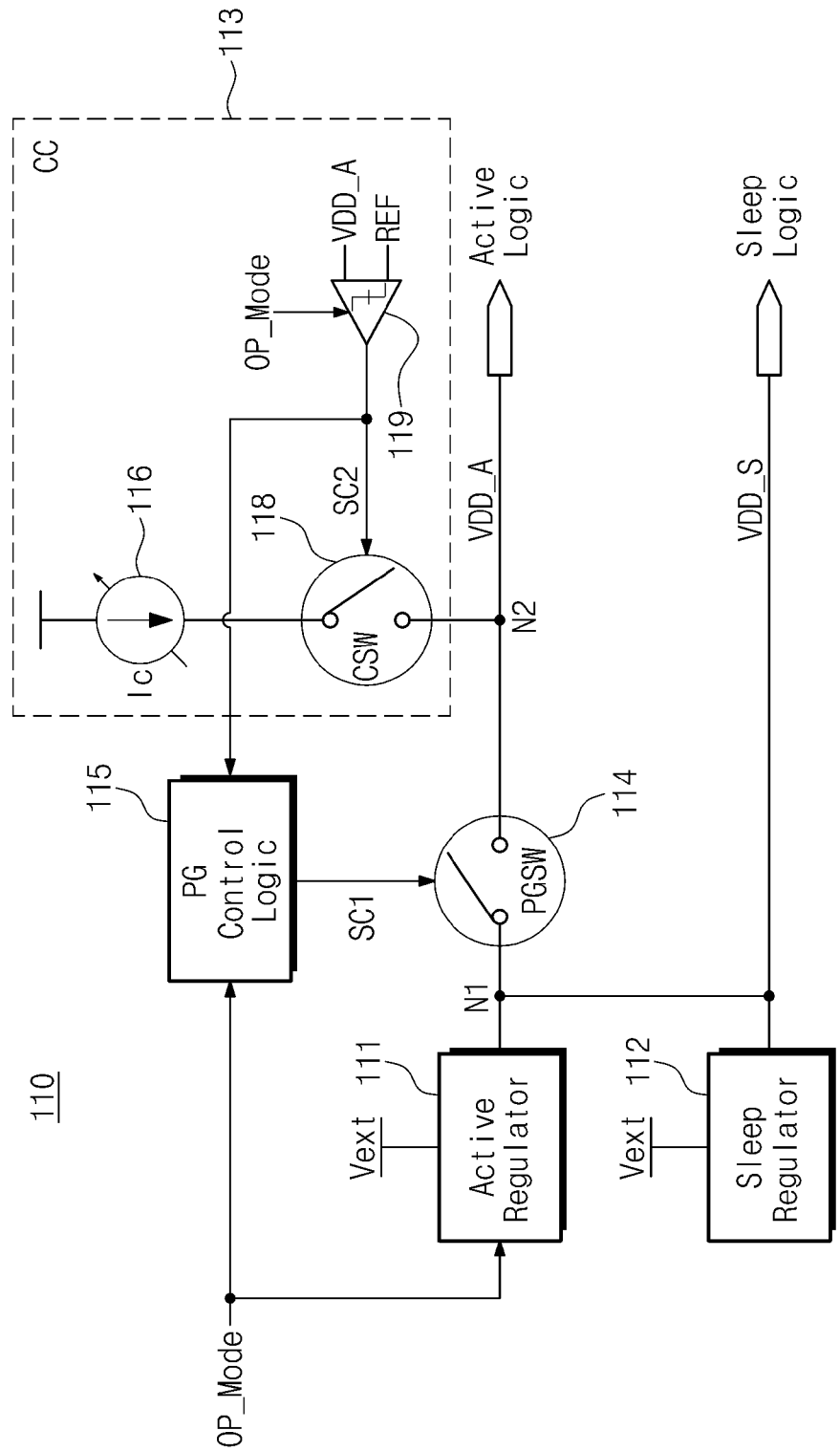
FIG. 3 is a drawing illustrating a constitution of the voltage regulator of FIG. 2 in further detail.

FIG. 3 is a drawing illustrating the voltage regulator 110 of FIG. 2 in further detail. Referring to FIG. 3, the voltage regulator 110 may include a power gate control logic 115 generating the first switch control signal SC1. The power gate control logic 115 can generate the first switch control signal SC1 according to the operation mode OP_Mode and receive a second switch control signal SC2 generated from the charging circuit 113.

The charging circuit 113 may include a current source 116, a charging switch 118 and a comparator 119. The charging circuit 113 charges the power input terminal N2 of the active logic 120 during the transient state (TS) the in which an operation mode is changed from the sleep mode to the active mode. The transient state TS is an initial time period of the active mode when the operation mode changes from the sleep mode to the active mode. That is, the transient time TS is a section in which the operation mode is changed from the sleep mode to the active mode but the active regulator 111 is not sufficiently activated. Thus, the charging circuit 113 charges the power input terminal N2 of the active logic 120 in advance during the transient state TS and sets up the power input terminal N2 of the active logic 120 to a desired voltage.

The charging circuit 113 transmits a charging current Ic being generated from the current source 116 to charge the power input terminal N2 during the transient terminal TS. The current source 116 may be, for example, a variable current source that can change amplitude of the charging current Ic. The amplitude of the charging current Ic being supplied by the current source 116 may be determined by a user. The current source 116 charges the power input terminal N2 of the active logic 120 in the transient state TS to increase a level of the drive voltage VDD_A.

The charging switch 118 transmits the charging current Ic to the power input terminal N2 of the active logic 120 in response to the second switch control signal SC2. The charging switch 118 can switch the charging current Ic being provided from the current source 116 in response to the second switch control signal SC2. A section in which the charging switch 118 is turned on is the transient state TS in which the sleep mode is finished and the operation mode enters the active mode. Thus, after the power input terminal N2 of the active logic 120 is sufficiently charged from the beginning of the active mode, the charging switch 118 is disconnected.

The comparator 119 generates the second switch control signal SC2 for switching the charging switch 118. A drive voltage VDD_A level of the power input terminal N2 being charged by the charging current Ic is fed back to the comparator 119. The comparator 119 compares a reference voltage REF with the drive voltage VDD_A fed back to the comparator 119 to generate the second switch control signal SC2. In the case that a level of the drive voltage VDD_A being charged by the charging current Ic is lower than the reference voltage REF, the comparator 119 generates the second switch control signal SC2 to turn on the charging switch 118. In the case that a level of the drive voltage VDD_A being charged by the charging current Ic is equal to or higher than the reference voltage REF, the comparator 119 generates the second switch control signal SC2 to turn off the charging switch 118. The comparator 119 operates based on the operation mode OP_mode. Thus, the comparator 119 can be activated in the active mode. Moreover, the comparator 119 may be inactive in the sleep mode.

The power gate control logic 115 generates the first switch control signal SC1 with reference to the operation mode OP_Mode and the second switch control signal SC2. In the case that the operation mode OP_Mode corresponds to the sleep mode, the power gate control logic 115 turns off the power gating switch 114. The power gate control logic 115 still maintains the power gating switch 114 at a turn-off state even at the moment when the operation mode OP_Mode is changed from the sleep mode to the active mode. The power gate control logic 115 turns on the power gating switch 114 at a time when the second switch control signal SC2 being provided from the charging circuit 113 turns off the charging switch 118. That is, the power gate control logic 115 turns on the power gating switch 114 after the active mode begins and the transient state TS is finished. To control the power gating switch 114 using the method described above, the power gate control logic 115 generates the first switch control signal SC1.

The drive voltage VDD_A being provided to the active logic 120 by the voltage regulator 110 can be supplied at a stable level even when the operation mode OP_Mode is changed. The power gating switch 114 and the charging switch 118 can be a P or N type high voltage transistor but inventive concepts are not limited to this example.

Figure 4:
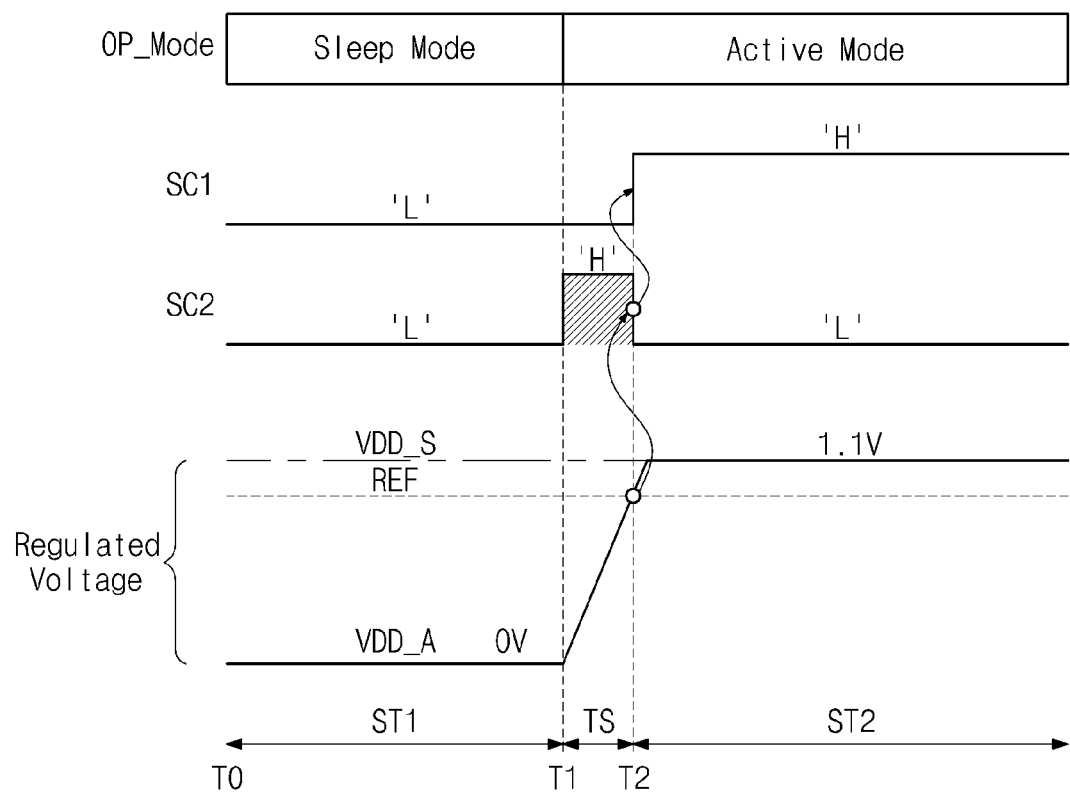
FIG. 4 is a timing diagram illustrating an operation of the voltage regulator of FIG. 3.

FIG. 4 is a timing diagram illustrating an operation of the voltage regulator 110 of FIG. 3.

Referring to FIGS. 3 and 4, according to a switching operation of the power gating switch 114 and the charging switch 118, a charge during the transient state TS and a switching with the active regulator 111 can be controlled. That is, the power input terminal N2 of the active logic 120 may be charged by the charging circuit 113 during the transient state TS and may be charged by the active regulator 111 after the transient state TS.

The memory system 100 is driven in the sleep mode from time T0 to time T1. The active regulator 111 is turned off in the sleep mode. The sleep regulator 112 maintains a turn-on state in the sleep mode and minimum power for maintaining a standby state of the memory controller 100 is supplied. That is, the sleep regulator 112 generates a drive voltage VDD_S to supply the generated drive voltage VDD_S to the sleep logic 130. A level of the drive voltage VDD_S is the same as the drive voltage VDD_A but the quantity of currents being supplied from the sleep regulator 112 is relatively small. Thus, power being consumed in the sleep mode can be minimized. The power gating switch 114 and the charging switch 118 maintain a turn-off state in the sleep mode. That is, in the sleep mode, the first switch control signal SC1 controlling the power gating switch 114 and the second switch control signal SC2 controlling the charging switch 118 are maintained at a low level.

At time T1, the sleep mode is finished and the active mode begins. That is, if a command is provided to the memory controller 100, the sleep mode has to be finished according to a wake-up operation. The memory controller 100 changes the operation mode OP_Mode to the active mode to perform an operation requested from the outside. Then, the active regulator 111 is activated and begins to generate a voltage. However, the power gating switch 114 still maintains a turn-off state, and the charging circuit 113 is activated.

At time T1, the comparator 119 activates the second switch control signal SC2 to turn on the charging switch 118. Then the drive voltage VDD_A of the power input terminal N2 of the active logic 120 increases by a supply of the charging current Ic from the current source 116. The charging operation by the charging circuit 113 continues until time T2 at which a level of the drive voltage VDD_A reaches the reference voltage REF.

At the time T2, a level of the drive voltage VDD_A reaches the reference voltage REF by the charging circuit 113. Then the second switch control signal SC2 drops to a low level L by the comparator 119 and the charging switch 118 is disconnected. In response to the transition of the second switch control signal SC2 to the low level L, the power gate control logic 115 transits the first switch control signal SC1 to a high level H. In response to the transition of the first switch control signal SC1, the power gating switch 114 is turned on. The active regulator 111 supplies the generated voltage to the power input terminal N2 of the active logic 120 charged to above the reference voltage. At the time T2, a voltage and a current generated from the active regulator 111 are set up to a level enough to drive the active logic 120. Thus, a voltage of the power input terminal N2 of the active logic 120 can be maintained at a level that causes a stable circuit operation.

An operation state of the voltage regulator 110 can be defined by three states, that is, a first state ST1, a transient state TS and a second state ST2. The first state ST1 corresponds to the sleep mode. In the first state ST1, the power gating switch 114 and the charging switch 118 are turned off and only the sleep regulator 112 is turned on. The transient state TS corresponds to a beginning section of the active mode. In the transient state TS, the power gating switch 114 is turned off and the charging switch 118 is turned on. In the second state ST2, a drive voltage is supplied by the active regulator 111 and the charging circuit 113 is deactivated. The transient state TS corresponds to an initial section in which the mode change from the sleep mode to the active mode occurs.

Operations of the power gating switch 114 cutting off the active regulator 111 and the power input terminal N2 of the active logic 120 and the charging circuit 113 charging the power input terminal N2 of the active logic 120 were described. Although the power input terminal N2 of the active logic 120 is relatively heavy load, it can be provided with the stable drive voltage VDD_A by setting up the transient state TS. In addition, when the operation mode OP_Mode is changed, the sleep logic 130 can be supplied with the stable drive voltage VDD_S without depending on a capacitor for an auxiliary power supply.

Figure 5:
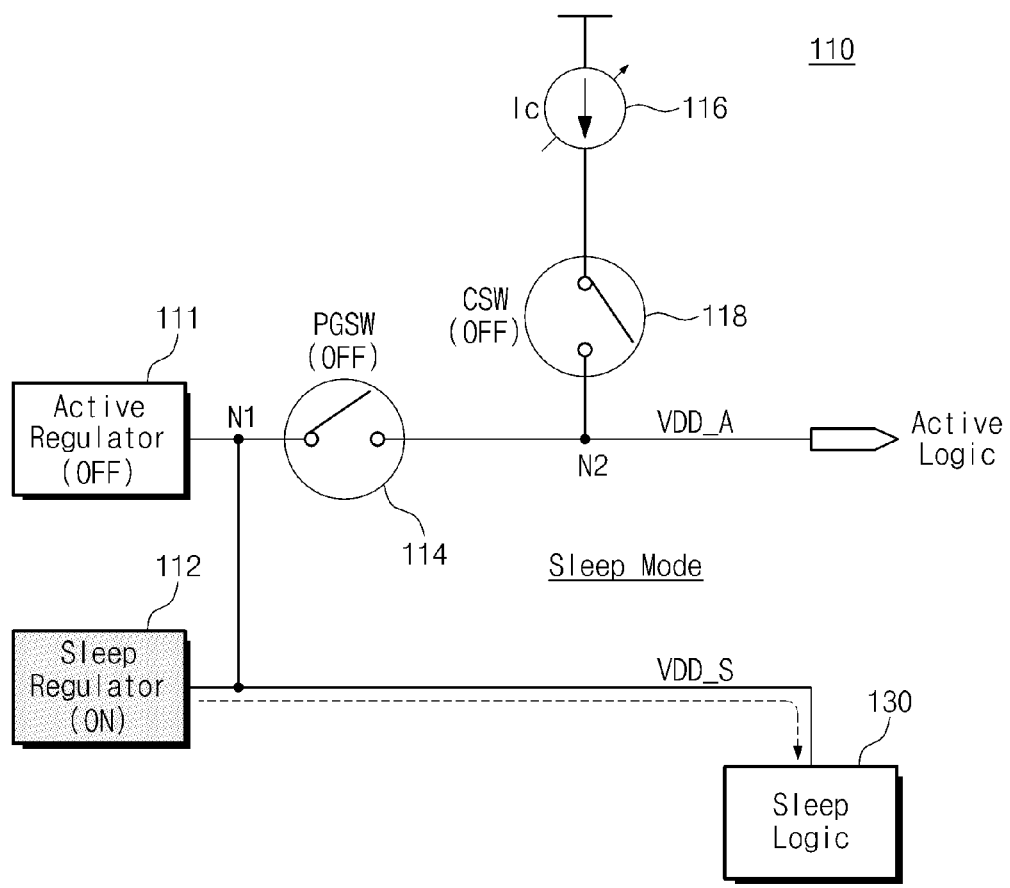
FIG. 5 is a circuit diagram illustrating a state of the voltage regulator in a sleep mode among operation sections of FIG. 4.

FIG. 5 is a circuit diagram illustrating the voltage regulator 110 in a sleep mode or a first state ST1 among operation sections of FIG. 4. Referring to FIG. 5, in the sleep mode, the active regulator 111 becomes power off and the power gating switch 114 and the charging switch 118 are disconnected. In the sleep mode, only the sleep regulator 112 is maintained at a power-on state.

As shown, the voltage regulator 110 maintains standby power in an idle state in which an access to the memory device 200 does not occur and cuts off power of the active logic 120 and the active regulator 111. When a wake-up request occurs in the idle state, the sleep logic 130 is driven to detect the wake-up request and change the operation mode OP-Mode to the active mode.

During the sleep mode, the active regulator 111 is inactive. That is, the active regulator 111 is turned off. In the sleep mode, the power gating switch 114 is disconnected and the charging circuit 113 is inactive. In a state in which the power gating switch 114 is disconnected and the charging circuit 113 is inactive, the sleep regulator 112 continuously generates the drive voltage VDD_S using an external voltage Vext. The sleep logic 130 operates using the drive voltage VDD_S provided from the sleep regulator 112 as a power supply.

Figure 6:
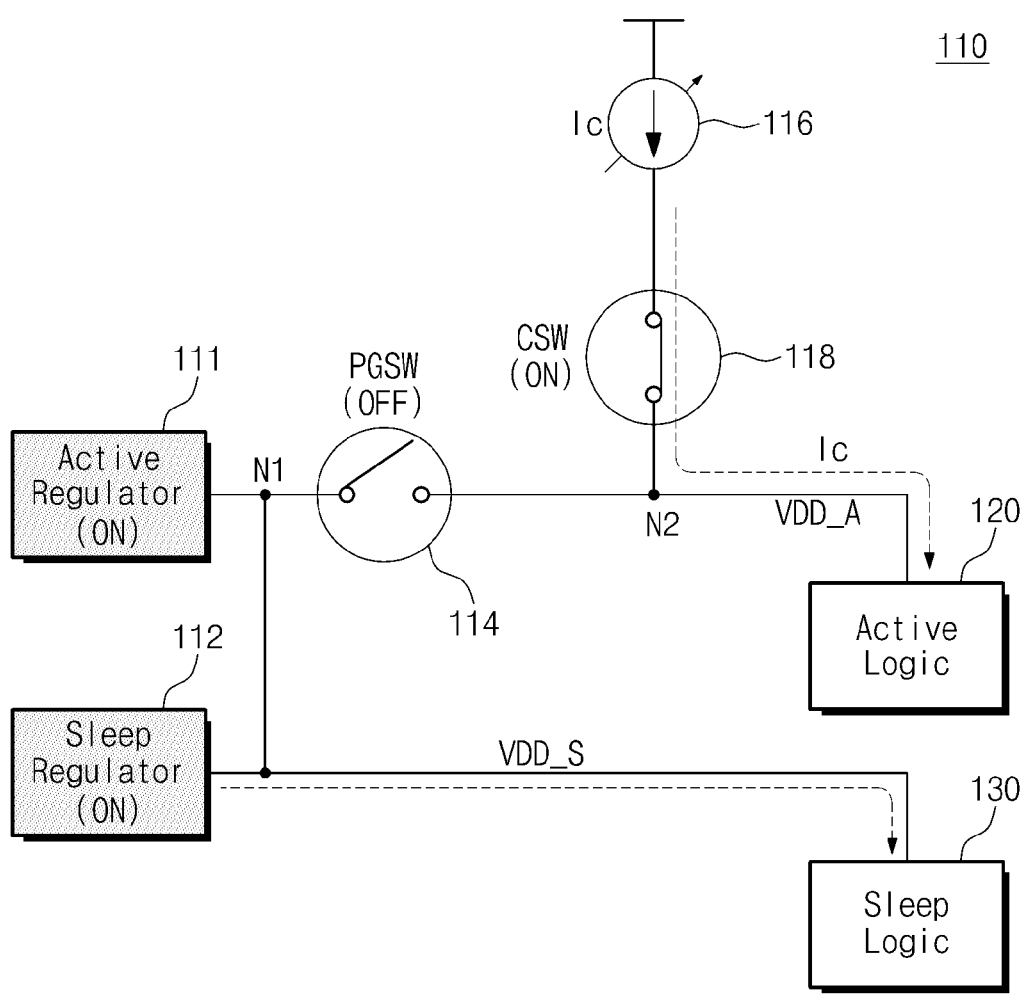
FIG. 6 is a circuit diagram illustrating a state of the voltage regulator in a transient state TS.

FIG. 6 is a circuit diagram illustrating a state of the voltage regulator 110 in a transient state TS. Referring to FIG. 6, in the transient state TS in which the sleep mode is finished and the active mode begins, a process is shown that the power input terminal N2 of the active logic 120 is boosted by the charging circuit 113. In the transient state TS, the active regulator 111 is in a power-on state. The active regulator 111 performs a voltage generation operation for supplying the drive voltage VDD_A using the external voltage Vext. However, since in the transient state, the power gating switch 114 is still maintained at a disconnection state, the output terminal N1 of the active regulator 111 maintains a state electrically separated from the power input terminal N2 of the active logic 120.

If the sleep mode is finished and the operation mode OP_Mode enters the transient state of the active mode, the charging circuit 113 is activated. First, the charging circuit 113 activates the second switch control signal SC2 in response to the mode change. Then the charging switch 118 is turned on. As the charging switch 118 is turned on, the charging current Ic being generated from the current source 116 can be transmitted to the power input terminal N2 of the active logic 120. A voltage level of the power input terminal N2 of the active logic 120 increases based on the charging current Ic. An increase of the drive voltage VDD_A level of the power input terminal N2 is fed back to the comparator 119 included in the charging circuit 113. Thus, if the drive voltage VDD_A of the power input terminal N2 increases to the reference voltage REF, the transient state TS of the active mode is finished.

Figure 7:
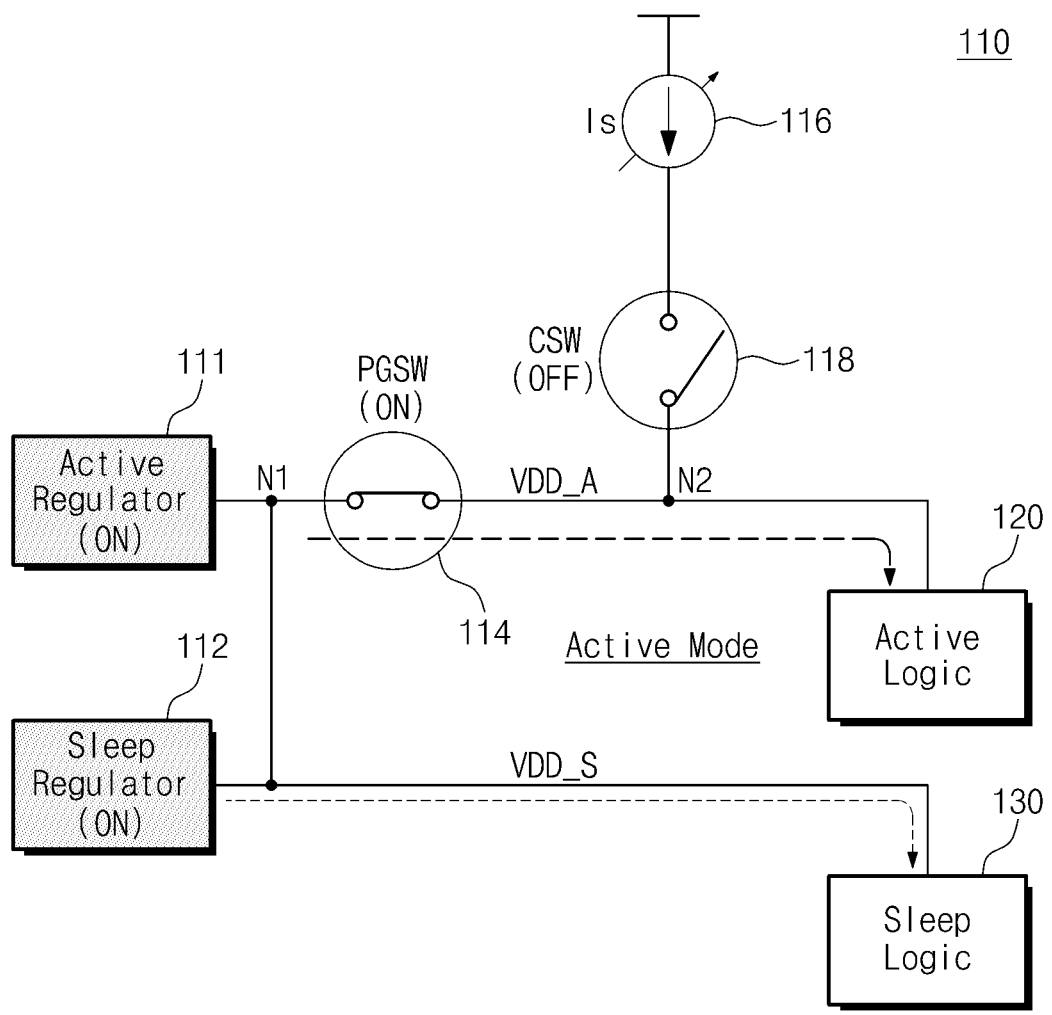
FIG. 7 is a circuit diagram illustrating a state of the voltage regulator after the transient state TS is over.

FIG. 7 is a circuit diagram illustrating a state of the voltage regulator 110 after the transient state TS is over. Referring to FIG. 7, if the transient state TS is over, the power gating switch 114 is turned on. The charging switch 118 of the charging circuit 113 is disconnected. In this state, a voltage generated from the active regulator 111 and the sleep regulator can be supplied to the active logic 120 and the sleep logic 130.

A level of the drive voltage VDD_A being set up in the power input terminal N2 of the active logic 120 in the transient state TS is already increased to above the reference voltage REF. In addition, although a voltage generation operation is vitalized and thereby the power gating switch 114 is turned on, the active regulator 111 can sufficiently handle a load by the active logic 120. Thus, even if the power gating switch 114 is turned on, a level of the drive voltage VDD_S being provided to an input terminal of the sleep logic 130 may not be greatly changed.

Although the active regulator 111 is immediately activated after the sleep mode is finished, it is cut off from the active logic 120 by the power gating switch 114 during the transient state TS. During the transient state TS, a level of the drive voltage VDD_A being provided to the power input terminal N2 of the active logic 120 from the charging circuit 113 increases. If the drive voltage VDD_A of the power input terminal N2 increases to above the reference voltage REF, the power gating switch 114 is turned on and the output terminal N1 of the active regulator 111 may be connected to the power input terminal N2 of the active logic 120.

Through the set up of the transient state TS, the power input terminal N2 of the active logic 120 is provided with the drive voltage VDD_A being at or higher than the reference voltage REF through the charging circuit 113. The active regulator 111 can be connected to the active logic 120 after the active regulator 111 is at a stage in activation to have a load ability during the transient terminal TS. Thus, instability of the drive voltage caused by a load increase that occurs when an operation mode is changed can be solved.

Figure 8:
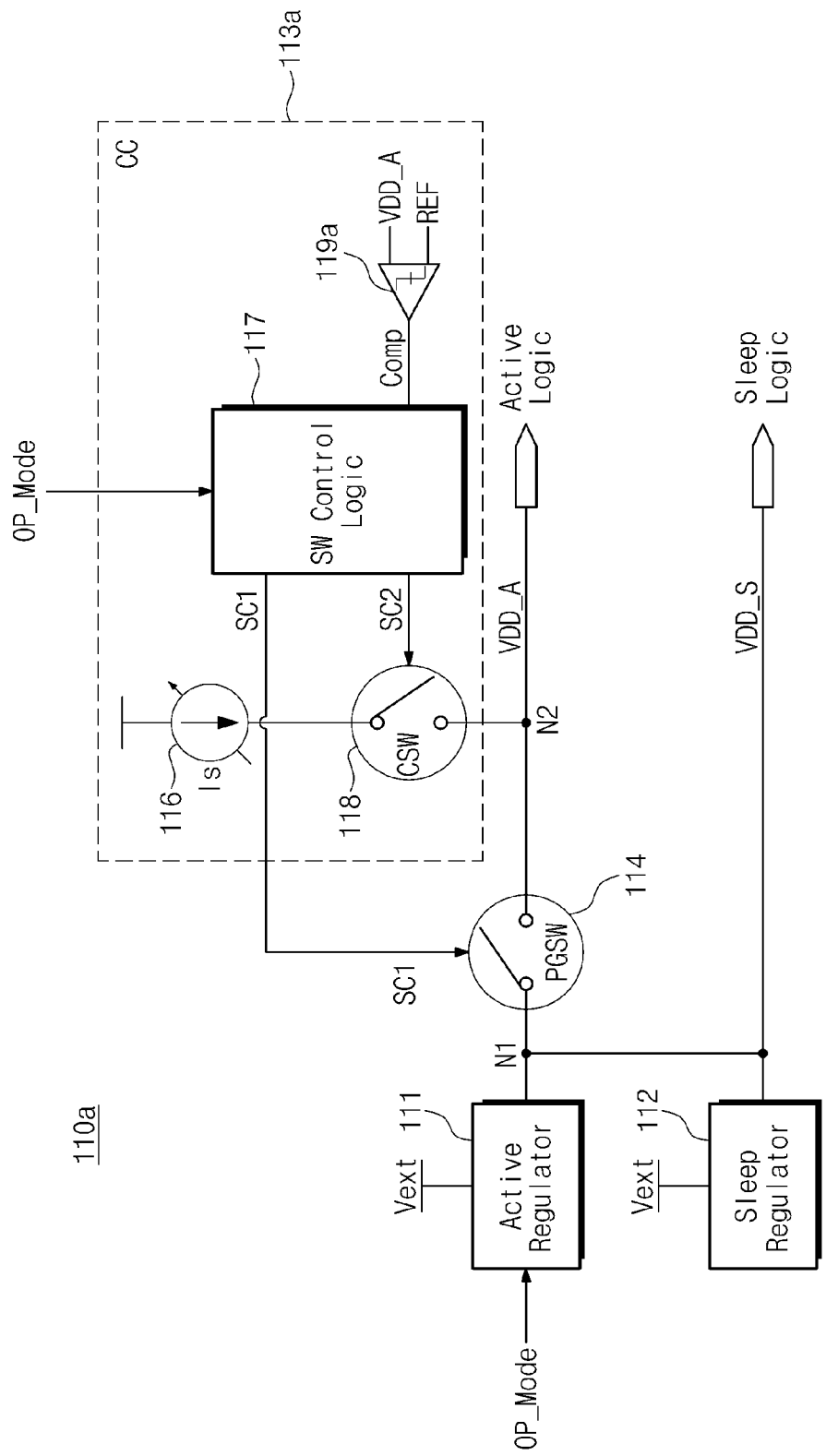
FIG. 8 is a circuit diagram illustrating a voltage regulator in accordance with another example embodiment of inventive concepts.

FIG. 8 is a circuit diagram illustrating a voltage regulator in accordance with another example embodiment of inventive concepts. Referring to FIG. 8, a voltage regulator 110a includes a charging circuit 113a generating a first switch control signal SC1 and a second switch control signal SC2. The charging circuit 113a can generate the first switch control signal SC1 and the second switch control signal SC2 with reference to an operation mode OP_Mode and an output of a comparator 119a.

The charging circuit 113a may include a current source 116, switch control logic 117, a charging switch 118 and the comparator 119a. The charging circuit 113a charges the power input terminal N2 of the active logic 120 during the transient state TS in which the operation mode is changed from the sleep mode to the active mode. An output voltage of the active regulator 111 may not be at a desired level in the transient state TS. Thus, the charging circuit 113a charges the power input terminal N2 of the active logic 120 to set up it to a desired level (i.e., at or higher than the reference level REF) in advance during the transient state TS.

The charging circuit 113a supplies a charging current Ic being generated from the current source 116 to the power input terminal N2 of the active logic 120 through the charging switch 118 to perform a charge operation during the transient state TS.

The switch control logic 117 generates the first and second switch control signals SC1 and SC2 with reference to the operation mode OP_Mode and an output of the comparator 119a. The switch control logic 117 generates the first and second switch control signals SC1 and SC2 so that the power gating switch 114 and the charging switch 118 are disconnected in the sleep mode. If the operation mode is changed from the sleep mode to the active mode, during the transient state TS, the switch control logic 117 generates the first and second switch control signals SC1 and SC2 so that the power gating switch 114 is turned off and the charging switch 118 is turned on. If the transient state TS is finished, the switch control logic 117 turns on the power gating switch 114 and turns off the charging switch 118.

To satisfy that operation condition, the switch control logic 117 generates the first and second switch control signals SC1 and SC2 with reference to the operation mode OP_Mode and a comparison result signal Comp of the comparator 119a.

Through the structure described above, the voltage regulator 110a cuts off the active regulator 111 and the active logic 120 in the transient state TS corresponding to a start time of the active mode. The voltage regulator 110a charges the voltage input terminal N2 of the active logic 120 through the charging circuit 113a during the transient state TS. Then, the voltage input terminal N2 of the active logic 120 is boosted to a level at or higher than the reference voltage REF. If the transient state TS is finished, the voltage regulator 110a cuts off the charging switch 118 and turns on the power gating switch 114. As a result, the active regulator 111 and the active logic 120 are connected to each other.

Figure 9:
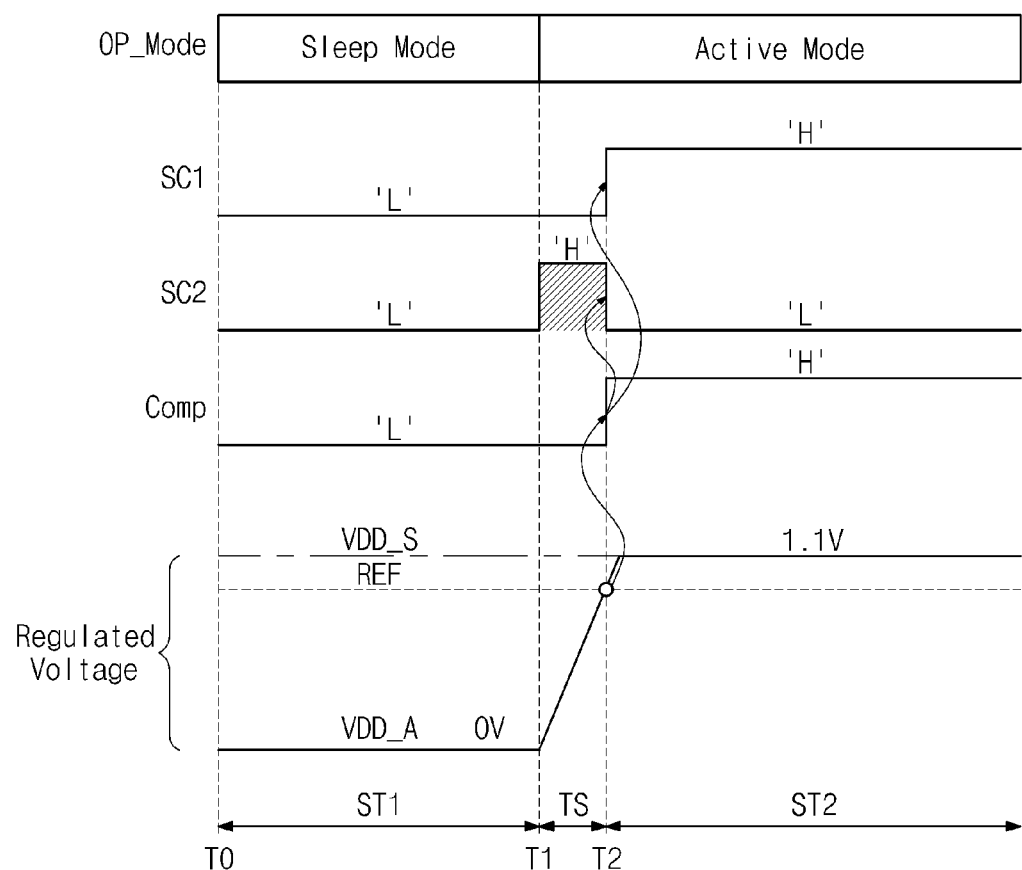
FIG. 9 is a timing diagram illustrating an operation of the voltage regulator of FIG. 8.

FIG. 9 is a timing diagram illustrating an operation of the voltage regulator 110a of FIG. 8. Referring to FIG. 9, the switch control logic 117 generates the first and second switch control signals SC1 and SC2 with reference to the operation mode OP_Mode and an output of the comparator 119a.

The switch control logic 117 outputs the first and second switch control signals SC1 and SC2 at a low level from time T0 to time T1 corresponding to the sleep mode. That is, in the sleep mode, the switch control logic 117 turns off the power gating switch 114 and the charging switch 118.

At the time T1, from which the active mode begins, the switch control logic 117 outputs the first switch control signal SC1 at a low level L and the second switch control signal SC2 at a high level H. Then, the power gating switch 114 still maintains a turn-off state. As the second switch control signal SC2 is activated, the charging switch 118 is turned on. As the charging switch 118 is turned on, the charging current Ic from the current source 116 flows into the power input terminal N2 of the active logic 120. Thus, a level of the drive voltage VDD_A being set up at the power input terminal N2 of the active logic 120 increases. A charging operation by the charging circuit 113a continues until the time T2 at which a level of the drive voltage VDD_A reaches the reference voltage REF. A section between the time T1 and the time T2 corresponds to the transient state TS.

At the time T2 at which a charging operation by the charging circuit 113a is finished, a level of the drive voltage VDD_A reaches the reference voltage REF. Then, the comparator 119a generates the comparison result signal Comp at a high level H. That is, if the drive voltage VDD_A being charged by the charging circuit 113a increases to the reference voltage REF, the switch control logic 117 cuts off the charging switch 118 and the turns on power gating switch 114.

In the timing diagram, operations of the active regulator 111 and the sleep regulator 112 in each operation section are the same as those of FIG. 4.

Figure 10:
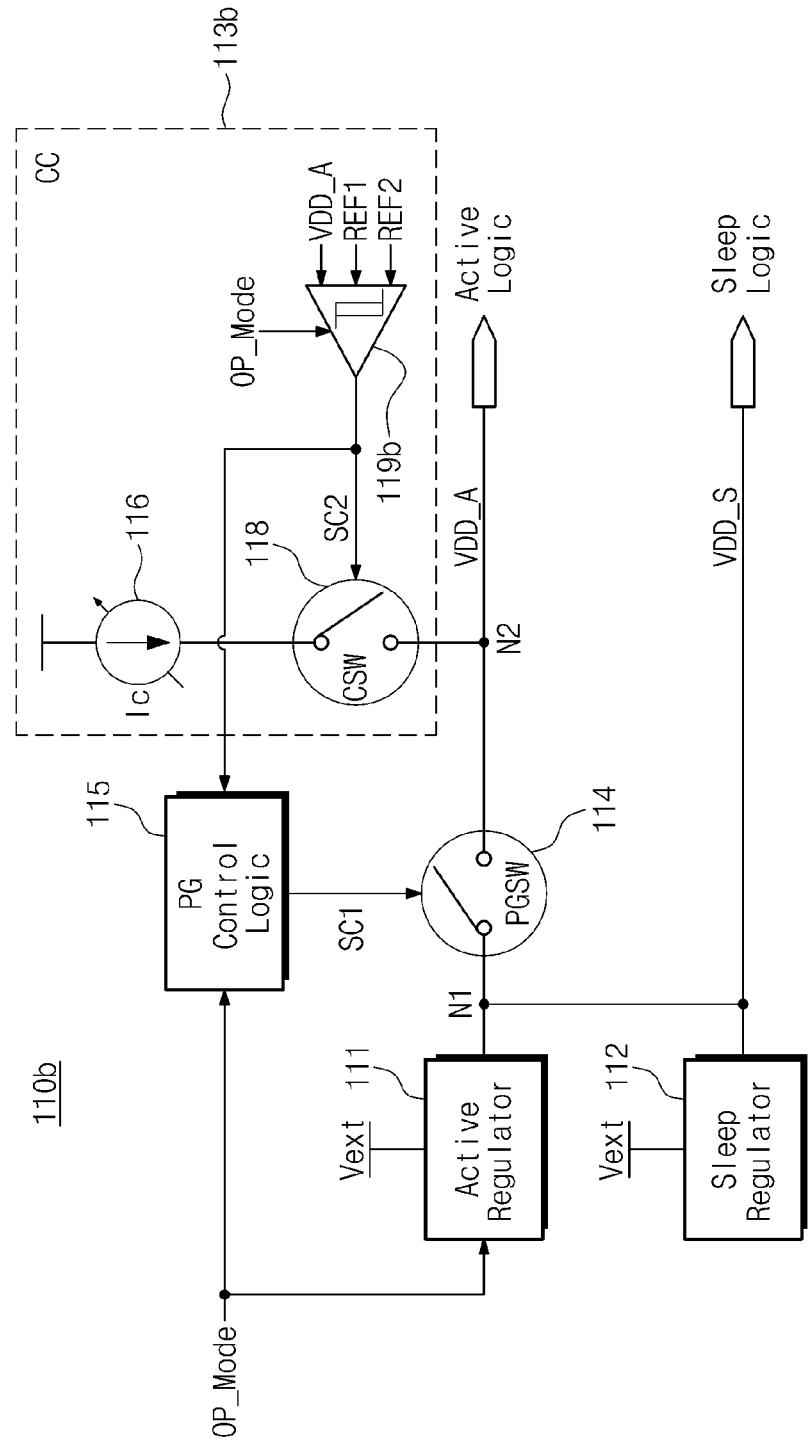
FIG. 10 is a block diagram illustrating a voltage regulator in accordance with still another example embodiment of inventive concepts.

FIG. 10 is a block diagram illustrating a voltage regulator 110b in accordance with still another example embodiment of inventive concepts. Referring to FIG. 10, a charging circuit 113b may include a hysteresis comparator 119b. The voltage regulator 110b can compare a level of the drive voltage VDD_A being charged by the charging circuit 113b with a reference voltage range REF1~REF2 to control the charging switch 118. Herein, the active regulator 111, the sleep regulator 112, the power gating switch 114 and the power gate control logic 116 are the same as those of FIG. 3. Thus, description thereof will be omitted.

The hysteresis comparator 119b is provided with a drive voltage VDD_A and reference voltages REF1 and REF2 through its input terminals. The hysteresis comparator 119b can apply different reference voltages when the second switch control signal SC2 transits from a low level L to a high level H and when the second switch control signal SC2 transits from the high level H to the low level L. That is, through the hysteresis comparator 119b, a relatively large margin can be obtained with respect to a change of the drive voltage VDD_A.

Figure 11:
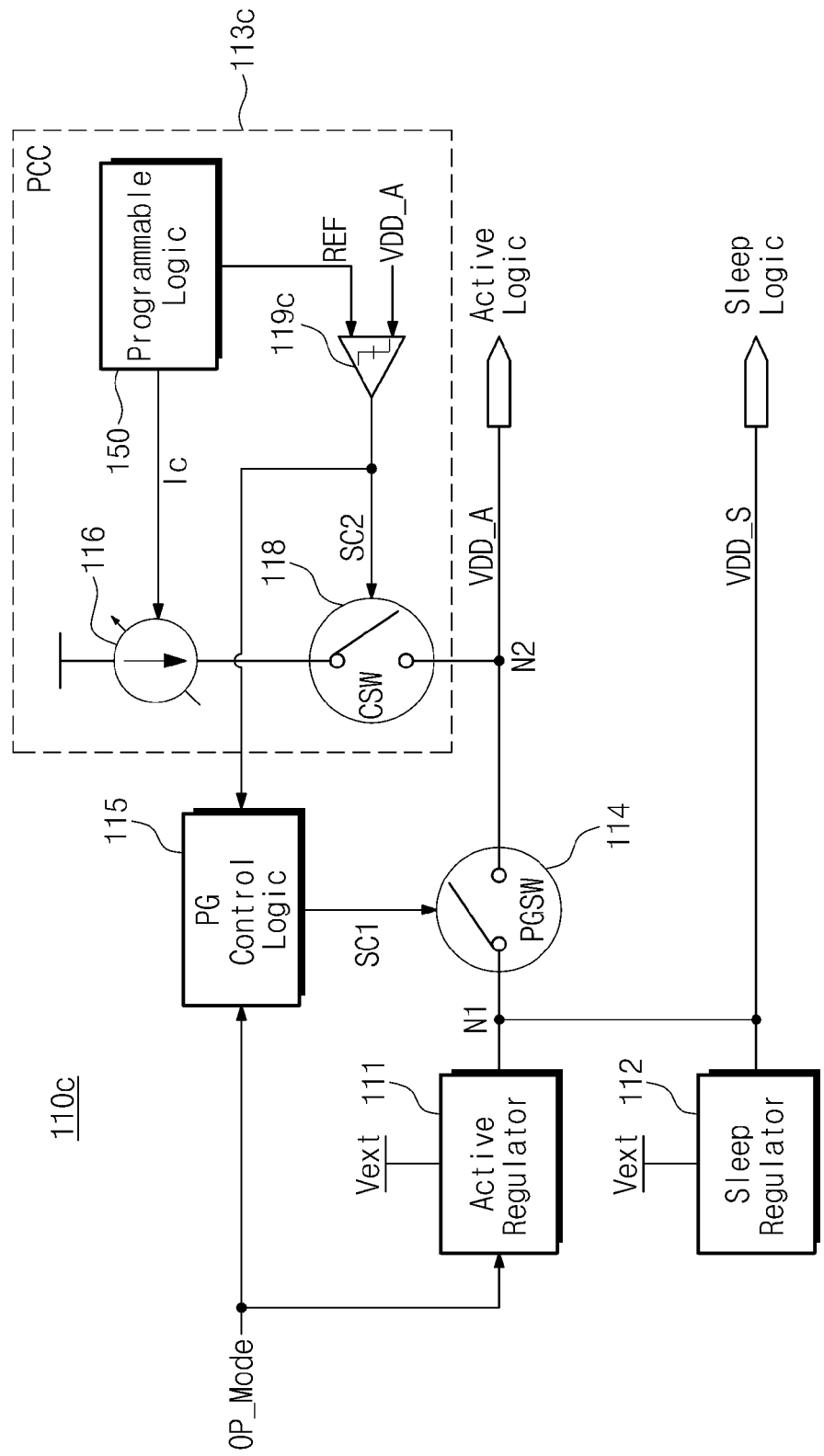
FIG. 11 is a block diagram illustrating a voltage regulator in accordance with yet another example embodiment of inventive concepts.

FIG. 11 is a block diagram illustrating a voltage regulator 110c in accordance with yet another example embodiment of inventive concepts. Referring to FIG. 11, a voltage regulator 110c may include a programmable charging circuit 113c.

The charging current Ic being supplied from the charging circuit 113c and the reference voltage REF being compared with the drive voltage VDD_A can be programmed by a user. To perform the function, the charging circuit 113c may include a programmable logic 150. In FIG. 11, the programmable logic 150 is included, but inventive concepts are not limited thereto. The programmable logic 150 may be embodied by various fuse option circuits included in a memory controller.

The programmable logic 150 includes logic arrays that can be programmed by a user. Amplitude of the charging current Ic being provided from the current source 116 is determined according to data being stored in the programmable logic 150. A level of the reference voltage REF being provided to the comparator 119c can also be set according to data being stored in the programmable logic 150.

Figure 12:
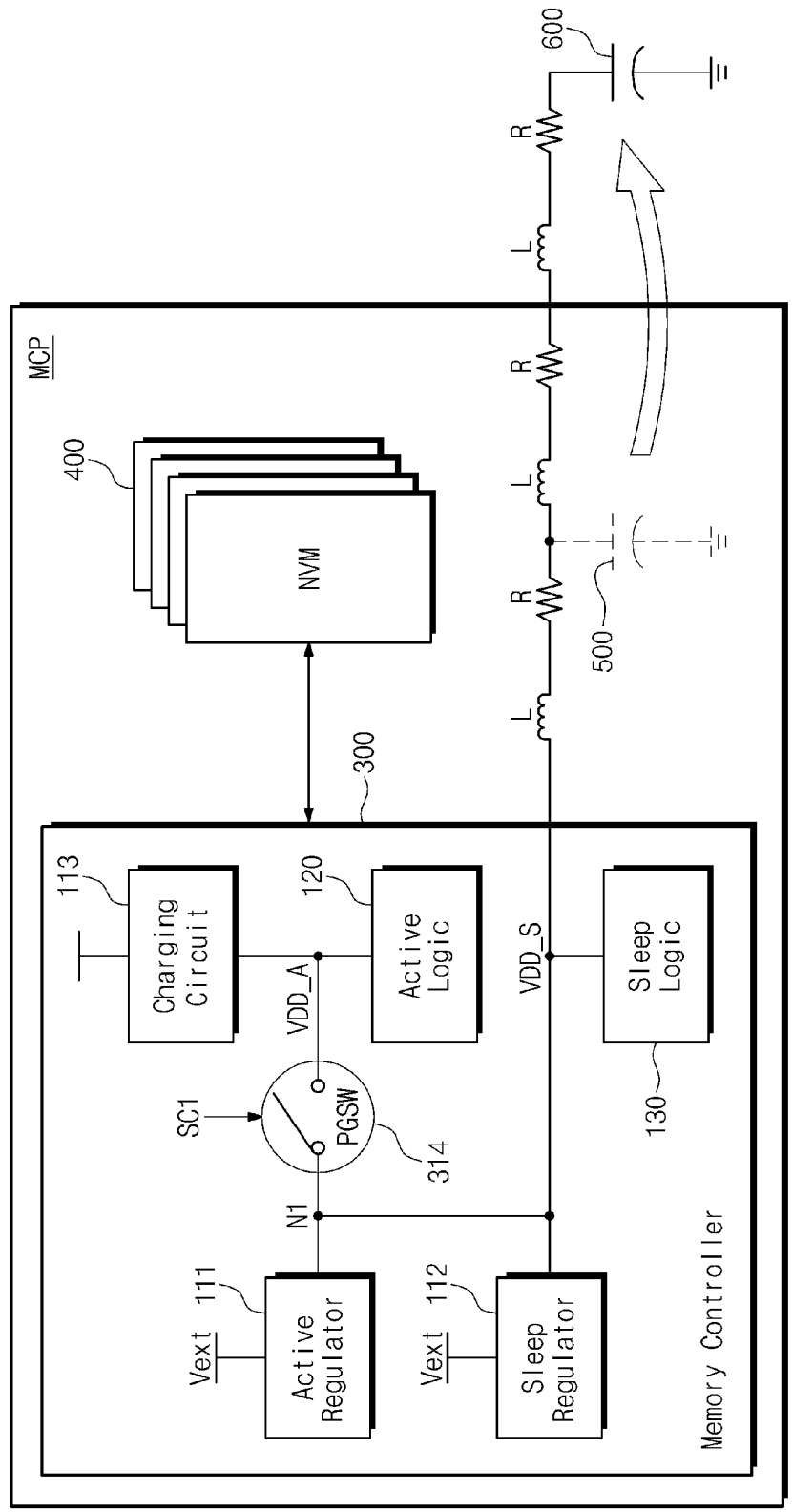
FIG. 12 is a block diagram illustrating a memory controller mounted on a memory card in accordance with an example embodiment of inventive concepts.

FIG. 12 is a block diagram illustrating a memory controller mounted on a memory card in accordance with an example embodiment of inventive concepts. Referring to FIG. 12, the memory card includes a memory controller 300 and a nonvolatile memory device 400 including at least one chip. The memory card may be connected to an external capacitor 600 for a power supply or have an internal capacitor 500 for the power supply. An active regulator 111, a sleep regulator 112, a charging circuit 113, a power gating switch 114, an active logic 120, and sleep logic 130 are the same as those described in FIGS. 1 and 2. Thus, descriptions thereof will be omitted.

In the case that the memory card is in a multichip package (MCP) form, the capacitor 500 or 600 for power supply can be mounted inside or outside the multichip package MCP. The capacitor 500 for power supply is mounted inside the MCP. In the case that the capacitor 500 for power supply is mounted inside the MCP, the sleep logic 130 is located near the power input terminal VDD_S. Thus, the capacitor 500 for power supply built in the multichip package MCP can contribute to solve voltage instability of the transient state. However, in the case that the capacitor 500 for power supply is built in the multichip package MCP, an increase of the multichip package MCP and an increase of manufacturing process step may occur.

According to the memory controller 300, high power supply stability can be provided without depending on the capacitor 500 or 600 for power supply by a charge in a transient state and a delayed power gating action.

Figure 13:
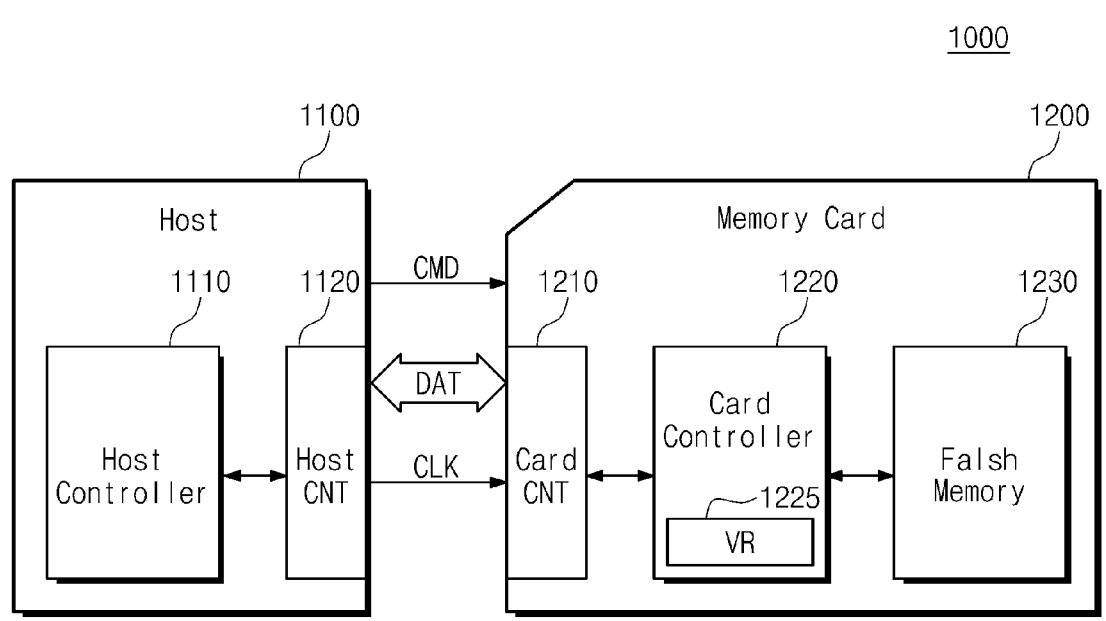
FIG. 13 is a block diagram illustrating a card system including an embedded multimedia card (eMMC) in accordance with an example embodiment of inventive concepts.

FIG. 13 is a block diagram illustrating a card system including an embedded multimedia card (eMMC) in accordance with an example embodiment of inventive concepts. Referring to FIG. 13, the card system 1000 includes a host 1100 and a memory card 1200. The host 1100 includes a host controller 1110 and a host connection unit 1120. The memory card 1200 includes a card connection unit 1210, a card controller 1220 and a flash memory 1230.

The host connection unit 1120 and the card connection unit 1210 are a plurality of pins. The pins may include a command pin, a data pin, a clock pin and a power supply pin. The number of pins may be different depending on a kind of the memory card 1200.

The host 1100 writes data in the memory card 1200 or reads data stored in the memory card 1200. The host controller 1110 transmits a command (e.g., a write command), a clock signal CLK generated from a clock generator in the host 1100 and data DATA to the memory card 1200 through the host connection unit 1120.

The card controller 1220 stores data in the flash memory 1230 in synchronization with a clock signal CLK generated from a clock generator in the card controller 1220 in response to a write command received through the card connection unit 1210. The flash memory 1230 stores data transmitted from the host 1100. In the case that the host 1100 is a digital camera, the flash memory 1230 stores image data.

The memory card 1200 may be an embedded multimedia card eMMC. The card controller 1220 includes a voltage regulator 1225. The voltage regulator 1225 includes the charging circuit and the power gating switch described in example embodiments of inventive concepts (e.g., voltage regulator 110). Thus, the voltage regulator 1225 can charge the power input terminal of the active logic while disconnecting the power gating switch in the transient state section in which an operation mode is changed from the sleep mode to the active mode. Since the power gating switch is turned on after the active regulator is sufficiently activated, a voltage can be stably supplied when an operation mode is changed.

The card connection unit 1210 is configured to communicate with the outside (for example, a host) through one of various interface protocols such as universal serial bus (USB), multimedia card (MMC), peripheral component interconnect express (PCI-E), serial attached small computer system interface (SCSI) (SAS), serial advanced technology attachment (SATA), parallel ATA (PATA), SCSI, enhanced small disk interface (ESDI), and integrated drive electronics (IDE).

Figure 14:
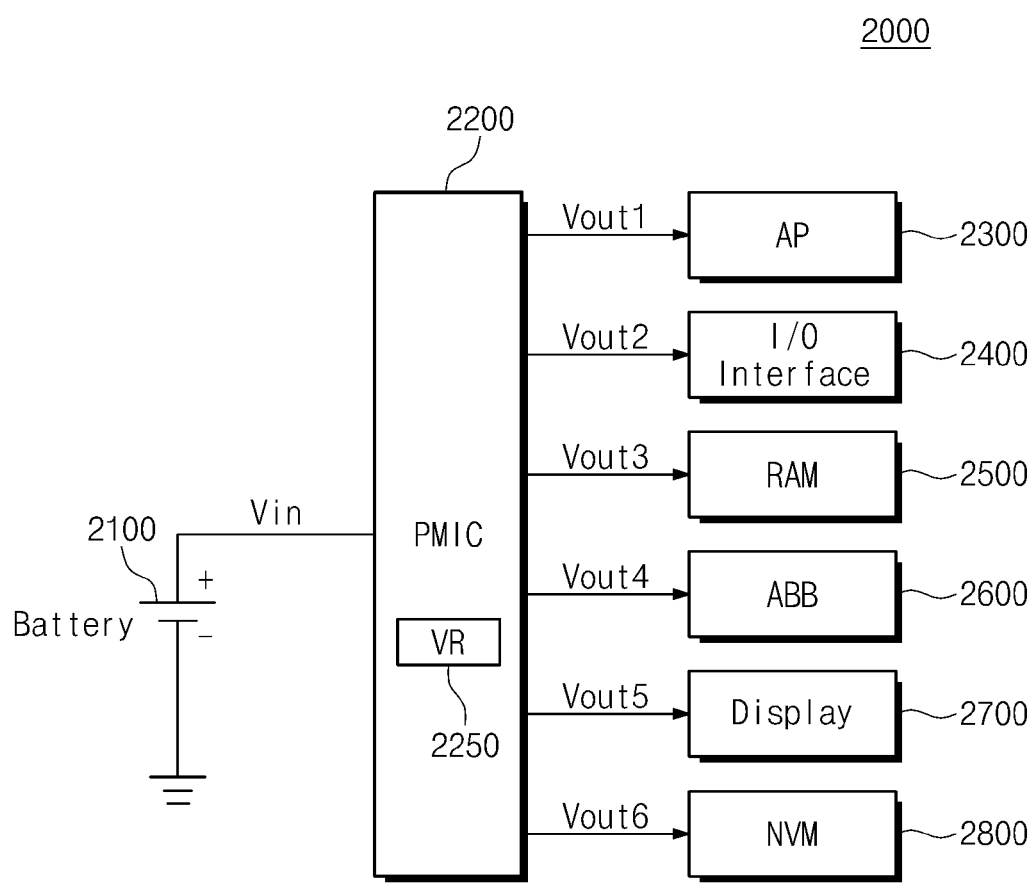
FIG. 14 is a block diagram illustrating a mobile device in accordance with an example embodiment of inventive concepts.

FIG. 14 is a block diagram illustrating a mobile device in accordance with an example embodiment of inventive concepts. Referring to FIG. 14, a mobile device 2000 may include a battery 2100, a power supply circuit 2200, an application processor 2300, an input/output interface 2400, a random access memory (RAM) 2500, an analog baseband chipset 2600, a display 2700 and a nonvolatile memory 2800.

The power supply circuit 2200 converts a power supply voltage Vin being provided from the battery 2100 into various levels Vout1~Vout6 to output them to various drive units. The power supply circuit 2200 includes a voltage regulator 2250, such as the voltage regulator 110, 110a or 110b. Thus, the power supply circuit 2200 can have stable and high power efficiency.

The system on chip in accordance with inventive concepts can be mounted using various types of packages. For example, the memory controller or the memory device can be mounted using various types of packages such as PoP (package on package), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP) and wafer-level processed stack package (WSP).

According to example embodiments of inventive concepts, there is provided a voltage regulator that can solve instability of power supply occurring when an operation mode is changed without depending on a capacitor for power supply, and a memory controller and a memory system that include the voltage regulator.

The above-disclosed subject matter is to be considered illustrative, and not restrictive, and the appended claims are intended to cover all such modifications, enhancements, and other embodiments, which fall within the true spirit and scope of inventive concepts. Thus, to the maximum extent allowed by law, the scope of inventive concepts is to be determined by the broadest permissible interpretation of the following claims and their equivalents, and shall not be restricted or limited by the foregoing detailed description.

What is claimed is:

1. A memory controller of a memory card comprising:
   an active regulator configured to operate in an active mode and be inactive in a sleep mode;
   an active logic configured to receive a drive voltage;
   a power gating switch configured to connect the active regulator to the active logic after a transient state of the active mode, the transient state being an initial time period of the active mode; and
   a charging circuit configured to charge the active logic during the transient state.

2. The memory controller of claim 1, wherein the charging circuit is configured to charge the active logic until a voltage of a power input terminal of the active logic reaches a reference voltage.

3. The memory controller of claim 2, wherein the transient state starts if the active mode begins, and the transient state ends if the voltage of the power input terminal reaches the reference voltage.

4. The memory controller of claim 1, wherein the memory controller is configured to close the power gating switch if the charging circuit is inactive.

5. The memory controller of claim 2, wherein the charging circuit comprises:
   a programmable logic circuit for setting a level of the reference voltage or an amplitude of a charging current from the charging circuit.

6. The memory controller of claim 1, further comprising:
   a sleep regulator configured to operate in the sleep mode and in the active mode, the sleep regulator configured to generate a sleep voltage; and
   a sleep logic configured to operate based on the sleep voltage.

7. The memory controller of claim 1, further comprising:
   a power gate control logic configured to open the power gating switch during the transient state and to close the power gating switch in response to the charging circuit.

8. The memory controller of claim 1, wherein the charging circuit comprises:
   a switch control logic configured to open the power gating switch during the transient state and to close the power gating switch based on a voltage of a power input terminal of the active logic.

9. A voltage regulator of a semiconductor device comprising:
   a first regulator configured to operate in an active mode and be inactive in a sleep mode;
   a second regulator configured to operate in the sleep mode and the active mode, the second regulator configured to generate a sleep voltage, the second regulator and the first regulator having a common output terminal;
   an active logic configured to receive a drive voltage;
   a sleep logic configured to operate based on the sleep voltage, the sleep voltage and the drive voltage having a same voltage level;
   a power gating switch configured to connect the common output terminal to a power input terminal of the active logic based on a state of the active mode; and
   a charging circuit configured to charge the power input terminal to a reference voltage during a transient state of the active mode, the transient state being an initial time period of the active mode.

10. The voltage regulator of claim 9, wherein the voltage regulator is configured to deactivate the charging circuit if the power input terminal has reached the reference voltage.

11. The voltage regulator of claim 10, wherein the voltage regulator is configured to open the power gating switch if the charging circuit is inactive.

12. The voltage regulator of claim 9, wherein the charging circuit comprises:
    a current source configured to generate a charging current for charging the power input terminal;
    a charging switch configured to connect the current source to the power input terminal; and
    a comparator configured to close the charging switch during the transient state and to open the charging switch based on a reference voltage and a voltage of the power input terminal.

13. The voltage regulator of claim 12, wherein the charging circuit is configured to open the charging switch if the voltage of the power input terminal increases above the reference voltage.

14. The voltage regulator of claim 12, wherein the current source comprises:
    a programmable variable current source configured to change an amplitude of a charging current for the active logic.

15. The voltage regulator of claim 12, wherein the voltage regulator is configured to change the reference voltage.

16. A memory controller comprising:
    an active logic configured to operate based on a drive voltage, the active logic configured to control an external memory device;
    a sleep logic configured to operate based on a sleep voltage, the sleep logic configured to detect a change of an operation mode of the memory controller; and
    a voltage regulator including,
      a charging circuit configured to supply the drive voltage to the active logic based on the detected change, and an active regulator configured to supply the drive voltage to the active logic if the drive voltage is greater than a reference voltage.

17. The memory controller of claim 16, wherein the charging circuit includes a charging switch configured to disconnect the charging circuit from the active logic based on the drive voltage and the reference voltage.

18. The memory controller of claim 17, further comprising:
a power gating switch configured to connect the active regulator to the active logic based on a status of the charging switch.

19. The memory controller of claim 18, wherein the power gating switch is is configured to close if the charging switch is opened.

20. The memory controller of claim 19, wherein the power gating switch is configured to open if the charging switch is closed.

* * * * *